United States Patent [19]

Nishida

[11] Patent Number: 5,002,796
[45] Date of Patent: Mar. 26, 1991

[54] PROCESS FOR FORMING FUNCTIONAL ZINC OXIDE FILMS USING ALKYL ZINC COMPOUND AND OXYGEN-CONTAINING GAS

[75] Inventor: Shoji Nishida, Nagahama, Japan

[73] Assignee: Canon Kabushiki Kaisha, Tokyo, Japan

[21] Appl. No.: 354,716

[22] Filed: May 22, 1989

[30] Foreign Application Priority Data

May 25, 1988 [JP] Japan ................................ 63-125792

[51] Int. Cl.$^5$ .............................................. B05D 3/02
[52] U.S. Cl. .................................... 427/45.1; 427/50; 118/119
[58] Field of Search .................. 427/45.1, 50; 118/119

[56] References Cited

U.S. PATENT DOCUMENTS 4,826,778  5/1989  Ishihara ............................. 427/45.1
4,853,251  8/1989  Ishihara ................................ 427/38

Primary Examiner—Stanley Silverman
Attorney, Agent, or Firm—Fitzpatrick, Cella, Harper & Scinto

[57] ABSTRACT

A functional zinc oxide deposited thin film having high light permeability and low resistivity can be obtained at a low temperature of about 200° C. on an inexpensive substrate such as glass by a method of activating a starting material gas by means of activation energy, in a space different from a film-forming space thereby forming a precursor contributing to the formation of a deposited film, activating a starting material gas in a space different from the film-forming space and the space just-mentioned above by means of activation energy thereby forming an active species that chemically reacts with the precursor, and introducing the precursor and the active species into the film-forming space, thereby depositing a film, wherein the starting material gas for forming the precursor is an alkyl zinc compound and the starting material for forming the active species is an oxygen gas or an ozone gas. This enables mass production of photovoltaic devices at high efficiency using a PN junction or PIN junction or high performance flat display device using liquid crystals, by which practical provision of power sources for domestic equipments or power sources for electric power appliance or large area display device can be obtained at a reduced cost.

4 Claims, 4 Drawing Sheets

PROCESS FOR FORMING FUNCTIONAL ZINC OXIDE FILMS USING ALKYL ZINC COMPOUND AND OXYGEN-CONTAINING GAS

FIELD OF THE INVENTION

The present invention concerns a process for forming functional zinc oxide films which are useful for active or passive semiconductor devices, particularly, for optical devices such as solar cells, liquid crystal displays and electroluminescence devices.

BACKGROUND OF THE INVENTION

ZnO has been used for quite a while as green fluorescent material for use in fluorescent display tubes or electrophotographic photosensitive materials and has also been applied as a constituent material in surface elastic wave devices. In recent years, a ZnO film has been noted as being an inexpensive transparent electroconductive film. Various studies have been made for its application to functional devices such as thin film solar cells, liquid crystal displays and electroluminescence (EL) devices. As for the method of forming such ZnO thin film, there have been known magnetron sputtering method, RF sputtering method, CVD method, spray method, etc. For example, the magnetron sputtering method is disclosed in Journal of Crystal Growth, 47 (1979), p 171; the RF sputtering method is disclosed in Japanese Journal of Applied Physics, 22 (1983), p, L 245; and the CVD method and the spray method are disclosed in Current Topics In Materials Science, 7 (1981), p 148 respectively.

Incidentally, in the application to thin film solar cells, liquid crystal display devices, EL device, etc., it is important that the ZnO thin film as formed has a high light permeability and a low volumic resistivity. Particularly, its volumic resistivity has a close relation to the structure of the film and it greatly depends on the formation method. That is, for reducing the volumic resistivity, it is necessary that the ZnO thin film be in the form of a crystalline thin film oriented along C-axis in the direction perpendicular to the plane of the film. The crystallinity greatly depends on the film-forming method and conditions. Further, in view of the domestic application use, it is necessary that under the method as employed, a ZnO thin film of good crystallinity can be formed easily on an inexpensive substrate, for example, a glass substrate at a good mass-productivity for providing inexpensive devices.

However, practical applicable ZnO thin films have not yet been provided by any of the above-mentioned methods because of the drawbacks as described below. That is, as shown in Japanese Journal of Applied Physics, 21 (1982), p 688, there has been a problem in the RF sputtering method including the magnetron sputtering method that high speed neutral oxygen atoms or oxygen negative ions caused in the film-forming space give impact shocks to the film surface to disturb the C-axis orientation, thereby increasing the resistivity upon forming the film.

In the CVD process, although the controllability is good and the mass-productivity is satisfactory, since a high temperature in excess of 500° C. is required because of the utilization of hydrolysis of chlorides, and thermal decomposition of organic compounds, there is restriction to the substrate used. Further, the spray method is suitable to the production of low cost films since the apparatus is inexpensive and the steps are simple, but the controllability is poor and the reproducibility of the film property is not satisfactory.

If a ZnO thin film of high light permeability and low resistivity can be formed on an inexpensive substrate or on a functional film deposited to the surface of such a substrate, the final module cost of the device can be reduced and, particularly, inexpensive photovoltaic devices which can be served for practical power source in domestic equipments or power appliance in thin film solar cells can be provide to the market. However, this can not be expected be attain by the conventional technique as described above accordingly, there has been an urgent demand for establishing a method of forming a thin film capable of depositing a ZnO thin film of good quality at a low temperature on a desired substrate.

SUMMARY OF THE INVENTION

The principal object of the present invention is to overcome the foregoing problems in the prior art and provide a method of forming a functional zinc oxide deposited film capable of easily attaining the improvement in the productivity and mass production of the film while improving the optical and electrical properties and the reproducibility of a ZnO deposited film formed and homogenizing the film quality.

Another object of the present invention is to provide a photovoltaic device having highly efficient opto-electronic conversion efficiency using a PN junction or PIN junction that can be used suitably as a power source for domestic equipments and power appliance represented typically by solar cells.

A further object of the present invention is to provide an optical display device typically represented by a light permeable or light reflection type flat display device having operation characteristics at high performance using liquid crystals.

A still further object of the present invention is to provide an optical device using a functional deposited film capable of having satisfactory light permeability and sufficiently low volumic resistivity even in a case where the film is formed on a substrate of inexpensive material such as glass, metal, ceramics, synthetic resin, etc. as an amorphous substrate or where the film is formed on a functional deposited film such as a semiconductor thin film formed on such a substrate.

The foregoing object of the present invention can be attained by a method of forming a functional zinc oxide deposited film, by activating a starting material gas with activation energy in a space different from a film-forming space, thereby forming a precursor contributing to the formation of a deposited film, activating a starting material gas in a space different from the film-forming space and from the just-mentioned space by means of activation energy, thereby forming species that chemically reacts with the precursor, and introducing the precursor and the active species into the film-forming space, thereby depositing a film, wherein the starting material gas for forming the precursor is an alkyl zinc compound and the starting material gas for forming the active species is an oxygen gas or an ozone gas.

According to the method of the present invention, it is possible to efficiently form a desired zinc oxide thin film with high light permeability and low resistivity on an inexpensive substrate such as glass maintained at a substrate temperature of about 200° C. This enables one to mass produce photovoltaic devices of high efficiency using PN junction or PIN junction or flat display devices of high performance using liquid crystals, making possible practical provision of power sources for domestic equipments and power appliance or large area display devices at reduced cost.

DETAILED DESCRIPTION OF THE INVENTION

Figure 1:
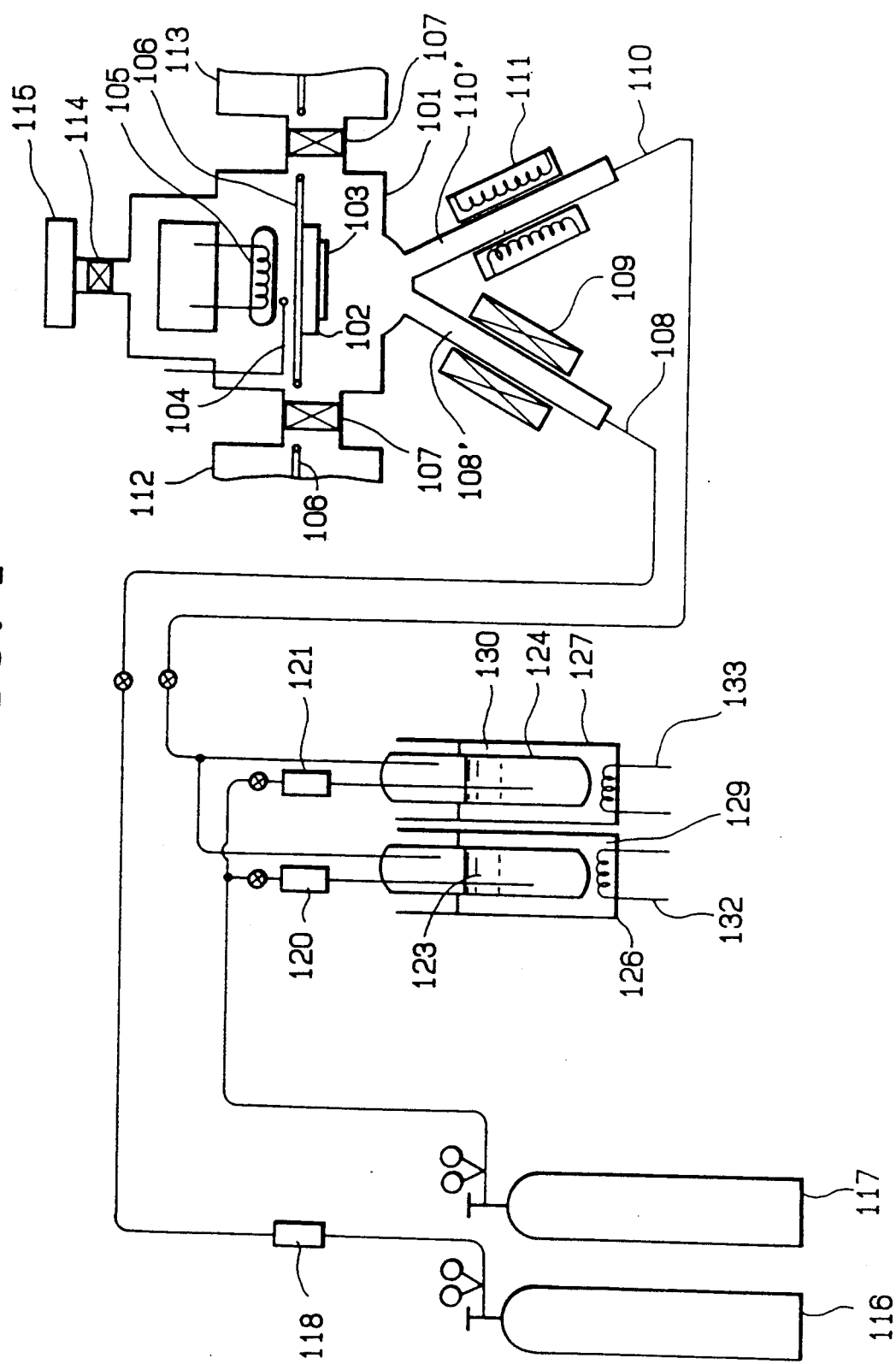
FIG. 1 and FIG. 2 are, respectively, schematic explanatory views for the embodiments of the apparatus suitable to practice the method according to the present invention.

The present invention has been accomplished as a result of earnest study made by the present inventors for overcoming the various problems in the prior art method in forming a ZnO film and attaining the foregoing objects and the present invention concerns a method of enabling efficient formation of a desired functional zinc oxide deposited film which has satisfactory property and general application use.

That is, the method of forming a functional zinc oxide deposited film according to the present invention comprises activating a predetermined starting gas in a space different from a film-forming space by means of activation energy such as microwave, thereby forming a precursor contributing to the formation of a deposited film, activating a starting material gas in a space different from the film-forming gas and from the just-mentioned space for forming the precursor by means of activation energy such as microwave thereby forming active species that chemically reacts with the precursor and introducing the precursor and the active species into the film-forming chamber, thereby conducting film deposition, wherein the starting material gas for forming the precursor is an alkyl zinc compound and the starting material gas for forming the active species is oxygen.

In the method of the present invention having the constitution as described above, the preamble portion corresponds to the fundamental concept for the HR-CVD method (Hydrogen Radical Assisted CVD Method) as disclosed in Japanese Patent Laid Open Sho 61-179869 and the present invention can be considered as a method developed from the HR-CVD method or as a sort of HR-CVD method in a broad meaning. That is, in Japanese Patent Laid Open Sho 61-179869, a deposited film is obtained by separately introducing (A) an active species formed by decomposing silicon and a halogen-containing compound in an activation space and (B) an active species formed by film-forming chemical substance that chemically reacts with the active species (A) in a different activation space respectively and bringing them into chemical reaction.

In the method as described in this laid-open publication, the compound for forming the active species (A) contains silicon and halogen and the compound for forming the active species (A) is disclosed, for the compound containing zinc and halogen, in Japanese Patent Laid Open Sho 61-189649. In the method according to the present invention, an alkyl zinc compound is used as the compound for forming the active species (A), while oxygen is used as the chemical substance for forming the active species (B).

In the method according to the present invention, a ZnO deposited film having optical and electrical properties which are much more excellent than those of the ZnO film as disclosed in the laid open publication mentioned above.

That is, in the method according to the present invention, since high energy atoms or ions are not present in the film-forming space for forming the deposited film, deposited film can be formed with no undesirable effects to the orientation of crystals, which would otherwise bring about a problem in the sputtering method, etc.

The method according to the present invention is different from the conventional CVD method in that a precursor previously activated in a space different from a film-forming space (hereinafter referred to as an activation space) and contributing to the formation of the deposited film and an active species that chemically react with the precursor are used. Since this can remarkably reduce the substrate temperature upon forming the deposited film while maintaining substantially the same film forming rate as that in the conventional CVD method, deposited films of stable film quality can be provided industrially in great quanities on inexpensive substrates such as glass.

In the method according to the present invention, the precursor contributing to the formation of the deposited film is formed by applying a predetermined activation energy to the starting material used for forming the precursor thereby exciting and decomposing the material.

As the starting material for forming the precursor, an easily gasifiable alkyl zinc compound represented by the general formula: R-Zn-R, in which R represents an alkyl residue with 1 to 4 carbon atoms is used suitably. As specific examples of the alkyl zinc compound, there can be mentioned, typically, dimethyl zinc (DmZn) and diethyl zinc (DEZn). Since the organic zinc compounds are liquid at normal temperature, they are bubbled and gasified upon use by using an inert gas such as Ar or He as the carrier gas.

As the starting material suitable for forming the active species used in the present invention, there can be mentioned $O_2$ gas, $O_3$ gas, etc.

An inert gas such as Ar or He or $H_2$ gas may be used together with the starting material gas.

As the activation energy for forming the precursor and the active species in the present invention, activation energy such as electric energy, for example, microwave, RF, low frequency wave or DC, heat energy, for example, obtained by heating with heaters, IR rays, etc. or optical energy can properly be used and such energies may be used in combination.

Further, an appropriate catalyst may be used with the starting material in forming the active species.

In the method according to the present invention, the ratio between the amount of the precursor and that of the active species introduced into the film-forming space is properly determined as required depending on the film deposition conditions, kind of the precursor and/or active species, etc., and it is preferably from 100:1 to 1:150 and, more preferably, from 80:2 to 1:80 (ratio of flow rate introduced).

Further, for the ZnO deposited film formed by the method according to the present invention, impurity element can be doped during film formation with an aim of remarkably improving the film property, particularly, electrical property. As the suitable impurity element used, there can be mentioned, Al, In, etc., Al being most preferred. The amount of the impurity doped is properly determined depending on the desired electrical and optical properties.

The material containing such an impurity element as the ingredient (impurity introducing material) is gaseous under normal temperature and normal pressure or gaseous at least under the activation condition and it is desirable to select those compounds that can be gasified easily in a usual gasifying device. As for the compound, there can be mentioned, specifically, Al $(CH_3)_3$, Al$(C_2H_5)_3$, In$(CH_3)_3$ and In$(C_2H_5)_3$. Since they are liquid under the normal temperature, they are bubbled and gasified by using an inert gas such as Ar or He as the carrier gas.

Further, the impurity introducing material may be introduced and activated together with the starting material gas for forming the precursor and/or starting material gas for forming the active species into the precursor forming space and/or active species forming space, or may be activated in a third activation space different from the respective activation species described above by properly selecting and using the activation energy as described above. Accordingly, the active species formed by activating the impurity introducing material with the activation energy (hereinafter referred to as "active species N") is introduced into the film-forming space in a state mixed with the precursor and/or active species or independently.

The amount of the active species N introduced into the film-forming space upon doping the deposited film to be formed is properly determined as required depending on the film deposition conditions, the type of the precursor and/or active species or the type of the deposited film formed. However, the amount of the starting material for forming the active species N is preferably from $1/10^6$ to 1/10, more preferably, from $1/10^5$ to 1/20 and, most preferably, from $1/10^5$ to 1/50 based on the starting material for forming the precursor.

The substrate used in the method according to the present invention may either be electroconductive or electrically insulative.

As the electroconductive substrate, there can be mentioned, for example, metal such as NiCr, stainless steel, Al, Cr, Mo, Au, In, Nb, Ta, V, Ti, Pt and Pd or alloys thereof.

As the electrically insulative substrate employed usually, there can be mentioned films or sheets of synthetic resins such as polyester, polyethylene, polycarbonate, cellulose acetate, polypropylene, polyvinylchloride, poly-vinylidene chloride, polystyrene and polyamide, glass, ceramics, paper, etc.

In the method according to the present invention, the pressure upon forming/mixing the precursor and the active species and, depending on the case, active species N in a space in an open communication with the film-forming space ("hereinafter referred to as a forming-mixing space") may preferably be determined to an optimum value while considering the reactivity between the materials and, generally, the pressure upon introducing the respective materials is, preferably, from $1 \times 10^{-7}$ to $3 \times 10^2$ Torr and, more preferably, from $1 \times 10^{-6}$ to $10^2$ Torr.

Further, the pressure in the film-forming space, that is, the pressure in the space in which the film-forming substrate is disposed, is controlled to a desired level by means of a differential exhaustion or exhaustion device in relation with the introduction pressure and the flow rate of the precursor, active species and, further, active species N in the forming-mixing space. It is preferably from $1 \times 10^{-3}$ to $1 \times 10^2$ Torr, more preferably, from $1 \times 10^{-2}$ to 30 Torr and, most preferably from $5 \times 10^2$ to 10 Torr.

The substrate temperature (Ts) upon film formation is properly determined in relation to the type of the deposited film formed and the type of the substrate used, and it is preferably from a room temperature to 600° C., preferably, from 50 to 500° C. and, most preferably from 100 to 450° C.

Figure 2:
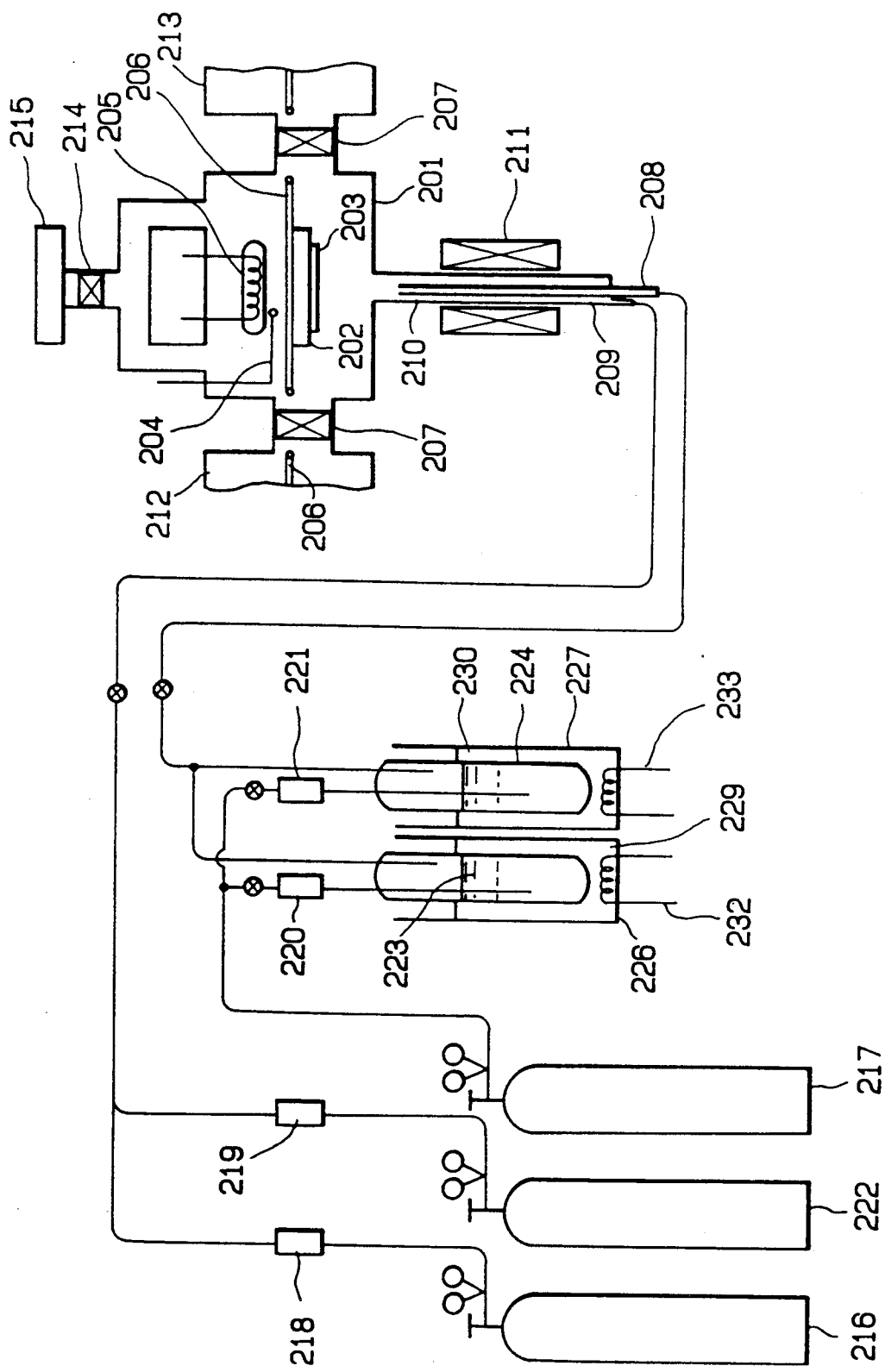

The method according to the present invention as has been described above can be practiced by means of an appropriate apparatus and those shown in FIGS. 1 and 2 can be mentioned as preferred embodiments for the apparatus.

In the apparatus shown in FIG. 1, a substrate 103 is secured on a substrate cassette 102 placed in a film-forming chamber 101. The substrate 103 is heated by radiation using an IR heater 105 under the monitor of a temperature monitor 104. The substrate cassette 102 is transported by a transportation device 106 by way of a gate valve 107 to another film-forming chamber 113 or a load lock chamber 112. The starting material gas for forming the precursor is introduced from a gas introduction pipe 108, activated in an activation chamber 108' by activation means 109 and then introduced into the film-forming chamber 101. On the other hand, the starting material gas for forming the active species is introduced from a gas introduction pipe 110, activated in an activation chamber 110' by activation means 111 and introduced into the film-forming chamber 101, which chemically reacts with the precursor to form a deposited film on the substrate 103. The activation means involve those means for decomposing, polymerizing, radicalizing, etc. the starting material gas for forming the precursor and the starting material gas for forming the active species by means of electric energy such as DC current, RF wave and microwave, light energy, heat energy or catalyst, thereby promoting the reaction between the starting material gas for forming the precursor and the starting material gas for forming the active species or promoting the reaction at the surface of the substrate.

The gas in the film-forming chamber is discharged by way of the valve 114 from the exhaust pump 115 and the inside of the film-forming chamber is kept at a predetermined pressure.

Further, for controlling the electric of property of the deposited film, the dopant material as described above is added to the starting material gas for forming the precursor or the starting material gas for forming the active species.

The apparatus illustrated in FIG. 2 is a modification of the apparatus shown in FIG. 1, in which an activation chamber 210 has at the central portion thereof a double-walled pipe comprising a precursor-forming transporting pipe 208 and an active species forming-transporting pipe 209 surrounding pipe 208. The precursor-forming transporting pipe 208 is opened while leaving such a distance to the inlet of the film-forming chamber 210 as the pre-cursor and the active species are preferably mixed before entering into the film-forming chamber 210, specifically, about from 0 to 50 mm, preferably, from 0 to 30 mm. The opening of the pipe 208 in the activation chamber 210 may have a nozzle or orifice structure (although not illustrated).

That is, the starting material gas for forming the precursor is excited and activated between the opening of the precursor forming-transporting pipe 208 and the inlet of the film-forming chamber 210 and introduced into the film-forming chamber 210 while being properly mixed with the active species, to form a deposited film on the substrate 203.

DESCRIPTION OF THE PREFERRED EMBODIMENTS

Formation of a desired ZnO thin film by practicing the method according to the present invention using the apparatus illustrated in FIG. 1 or FIG. 2 is to be explained specifically, but the present invention is not restricted to these examples.

EXAMPLE 1

A ZnO thin film was deposited by using the apparatus shown in FIG. 1 and electrical and optical properties were evaluated.

A #7059 glass substrate 103 made by Corning Co., sized 50 mm × 50 mm was fixed to the substrate cassette 102 on the substrate transporting device 106 in the load lock chamber 112 and the inside of the load lock chamber 112 was evacuated to a pressure lower than $10^{-5}$ Torr by means of an exhaust pump not illustrated. Meanwhile, the film-forming chamber 101 was evacuated to a pressure lower than $10^{-5}$ Torr by means of the exhaust pump 115. When the pressures in both of the chambers became equal, the gate valve 107 is opened and the substrate cassette 102 was transported by the substrate transporting device 106 to the film-forming chamber 101.

Then, the substrate was heated to a temperature of 200° C. by the IR heater 105.

$O_2$ gas (dilution with $Ar:O_2/Ar=1\%$) stored in the gas reservoir 116 was introduced into the gas introduction pipe 108 while controlling the flow rate to 10 sccm by the mass flow controller 118 and, after keeping the inner pressure of the film-forming chamber 101 to 0.5 Torr by controlling the opening degree of the exhaust valve 114, microwave power of 2.45 GHz at 200 W was charged from the microwave generation device 109.

Then, Ar gas stored in the gas reservoir 117 was introduced into liquid DEZn in the Dewer bottle 124 at a flow rate of 15 sccm under control by the mass flow controller 121, in which bubbling was effected and Ar gas saturated with DEZn was introduced into the gas introduction pipe 110, decomposed in the activation chamber 110' previously heated to 500° C. by the electric furnace 111 and, thereafter, introduced into the film-forming chamber 101 to conduct film formation while keeping the inside pressure to 0.5 Torr.

The amount of DEZn introduced was $1.5 \times 10^{-6}$ mol/min, which was set by controlling the temperature of thermo-stable water in the thermostable water vessel 127 at the outside of the Dewer bottle 124 storing DEZn, thereby controlling the temperature of the starting liquid material. In the drawing, 130 represents thermostable water for controlling temperature and 133 represents a heater.

The film-forming time was 3 min and the thickness of the deposited ZnO film was 5000 Å. The above-mentioned film-forming conditions are collectively shown in Table 1. Electrical and optical properties of the resultant ZnO film are shown in Table 2. For the comparison, the property of the ZnO film formed under the film-forming conditions shown in Table 3 by using an ordinary RF sputtering apparatus are also shown. Sputtering was conducted by using the same #7059 glass substrate manufactured by Corning Co. sized 50 mm × 50 mm as described above, placing a ZnO sintered target of 80 mm diameter at a position 6 mm above the substrate, and maintaining the inside pressure to 0.05 Torr with Ar gas atmosphere, at a RF power of 50 W. The substrate temperature was 85° C. and the thickness of the deposited film was 5000 Å.

From the results in Table 2, it can be seen that the ZnO film formed by the method according to the present invention is excellent both in the optical and electrical properties and the deposition rate was greater over that formed by the RF sputtering method and, accordingly, the ZnO film obtained by the method according to the present invention is extremely useful as a transparent electroconductive film used for optical devices.

Further, when the surface structure of the ZnO film formed by reflection electron ray diffractiometry was analyzed, it has been found that a reflection pattern from the surface (002) was observed in the ZnO film according to the present invention and C-axis orientation in the direction perpendicular to the plane of the film was observed, whereas such C-axis orientation was not observed in the ZnO film obtaining by the RF sputtering method. Thus, since undesired effects due to high energy atoms or ions are eliminated by the method according to the present invention, a ZnO film having satisfactory crystallinity can be obtained.

In the method as described above, film-formation was conducted by replacing $O_2$ gas with $O_3$ diluted with Ar gas ($O_3/Ar=1$ vol%) in the gas reservoir 116 and the gas was introduced through the gas introduction pipe 108. $O_3/Ar$ gas was controlled to 10 sccm by the mass flow controller 118. The electrical and optical properties of the ZnO film obtained in this way were identical with those obtained by the method above shown in Table 2.

EXAMPLE 2

An Al-doped Zn film was deposited in the same manner as in Example 1 using the apparatus shown in FIG. 1. The film-forming procedures and film-forming conditions were the same as those described in Example 1 except for using $Al(C_2H_5)_3$(TEAl) as the dopant and introducing liquid TEAl stored in the Dewer bottle 123 bubbled by an Ar gas at the flow rate of 5 sccm into the gas introduction pipe 110 upon introducing DEZn into the activation chamber 110'. The amount of TEAl introduced was set to $4.5 \times 10^{-9}$ mol/min by controlling the temperature of the thermostable water in the thermostable water vessel 129 placed outside of the Dewer bottle 123 by a heater.

Electrical and optical properties of the resultant ZnO:Al film are shown in Table 4. From the results, it has been found that the electrical property of the ZnO:Al film by the method according to the present invention is further improved over the ZnO film not doped with Al by the method according to the present invention.

EXAMPLE 3

A ZnO film and a ZnO:Al film were deposited in the same procedures as in Examples 1 and 2 using the apparatus shown in FIG. 2. The films were formed by using DMZn as the starting material for forming the precursor, $H_2$ gas and $O_2$ gas diluted with Ar ($O_2$/Ar=1 vol%) for forming the active species and Al(CH$_3$)$_3$(TMAl) as the dopant respectively. In the film-forming procedures, after heating the substrate as shown in Example 1, a $H_2$ gas stored in the gas reservoir 216 was controlled to 5 sccm by the mass flow controller 218 and the $O_2$/Ar gas stored in the gas reservoir 222 was controlled to 10 sccm by the mass flow controller 219 respectively, and they were introduced while being mixed with each other to the active species forming-transporting pipe 209. On the other hand, the Ar gas from the gas reservoir 217 was controlled by the mass flow controller 221 and introduced at a flow rate of 15 sccm into liquid DMZn stored in the Dewer bottle 224 for bubbling and the Ar gas saturated with DMZn was introduced into the precursor forming-transporting pipe 208. The flow rate of DMZm was $1.5 \times 10^{-6}$ mol/min. Upon doping, the gas from the Ar gas reservoir 217 was further controlled by mass flow controller 220 and introduced into liquid TMAl stored in the Dewer bottle 223 at a flow rate of 5 sccm. The Ar gas saturated with TMAl was mixed with the Ar gas saturated with DMZn and introduced into the precursor forming-transporting pipe 208. The flow rate of the TMAl introduced was $4.0 \times 10^{-9}$ mol/min.

Then, the inside pressure of the film-forming chamber 201 was maintained to 0.2 Torr by controlling the opening degree of the exhaust valve 214. Then, a microwave power of 2.45 GHz was charged at 200 W from the microwave generator 211 to start the film-formation.

The film-formation time was 5 min and the thickness of the deposited film was 5000 Å for each of the ZnO and ZnO:Al films. The film-forming conditions are shown collectively in Table 5.

Electrical and optical properties of the ZnO film, ZnO:Al film thus obtained are shown in Table 6.

EXAMPLE 4

Figure 3:
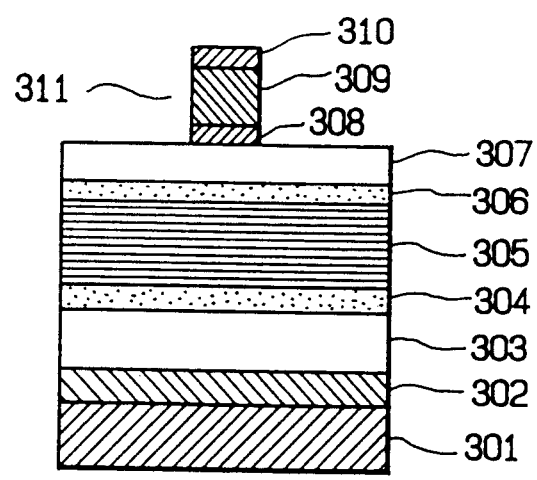
FIG. 3 is a schematic view illustrating the layer structure of a PIN type a-Si solar cell.

A pin junction type photovoltaic device of a structure as shown in FIG. 3 was prepared by using ZnO, ZnO:Al films shown in Example 3.

The structure of the device shown in FIG. 3 was: SUS 301/Ag 302/ZnO 303/n+.a-Si 304/i.a-Si 305/p+.μc-Si 306/ZnO:Al 307/Cr 308/Ag 309/Cr 310 from the side of the substrate. At first, Ag 302 was vapor-deposited by means of RF magnetron sputtering at an Ar flow rate of 25 sccm under a pressure of $5 \times 10^{-3}$ Torr and at a room temperature to a thickness of 3000 Å on the substrate 301. The charged electric power was 60 W and sputtering rate was 100 Å/min.

Then, a ZnO film 303 was formed on the SUS substrate 301 deposited with Ag 302 in the same manner as in Example 3. Then, a-Si films 304, 305 and 306 were deposited in the order of n, i, p from below on the ZnO film 303 by using an ordinary diode type plasma CVD apparatus. Among them, for the film-formation of the p layer 306, the film was finely crystallized by increasing the discharge power (referred to as p+.μc-Si). In this case, the plasma apparatus was connected by way of the gate valve 207 with the film-forming chamber 201 in the ZnO film forming apparatus by the method according to the present invention and it was of a three chamber separation type capable of forming the respective n, i, p layers independently. Film-forming conditions for the respective n, i, p layers are shown in Table 7.

After forming the films for each of a-Si layers 304, 305 and 306, the substrate 301 was again transported by way of the gate valve 207 to the film-forming chamber 201 and the ZnO:Al film 307 as the transparent electroconductive layer was deposited in the same procedures as in Example 3. Finally, each of Cr 308/Ag 309/Cr 310 was vapor deposited to the thickness of 200 Å/10,000 Å/400 Å respectively on the ZnO:Al film 307 to form a collector electrode 311 by using an ordinary vacuum vapor depositing apparatus and a metal mask.

The photovoltaic characteristics of the resultant photovoltaic device under AM1 light irradiation are shown in Table 8. For the comparison, characteristics of a photovoltaic device formed under the same forming conditions as described above except for forming ZnO, ZnO:Al films by the RF sputtering shown in Example 1 are also shown together. For the film formation of ZnO:Al by RF sputtering, ZnO sintering product containing 2 wt% of Al$_2$O$_3$ was used as a target (80 mm diameter) under the same conditions as shown in Table 3. The characteristics of the ZnO:Al film in this case were substantially the same for the light permeability and showed a value lower by about 20% for the resistivity as compared with the ZnO film prepared by the RF sputtering method in Table 2.

As shown from Table 8, the photovoltaic device using the ZnO, ZnO:Al films obtained by the method according to the present invention as the transparent electroconductive films show higher short-circuit photocurrent and curve factors than those of using ZnO, ZnO:Al film prepared by RF sputtering.

Figure 4:
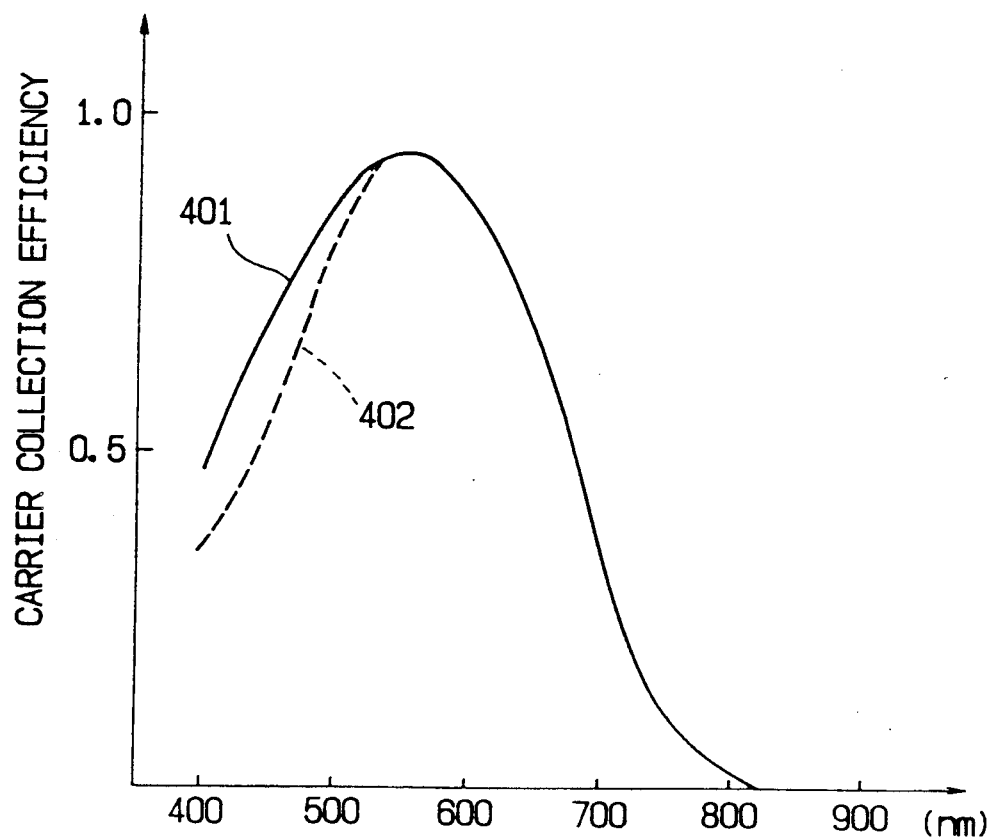
FIG. 4 is a graph illustrating the wavelength dependency of the carrier collection efficiency of a PN type aSi solar cell.

Further, when the wavelength dependency of the carrier collecting efficiency was examined, the carrier collecting efficiency 402 for the photovoltaic device using the ZnO, ZnO:Al films by the RF sputtering is worsened on the side of shorter wavelength than the carrier collecting efficiency 401 of the photovoltaic device using the ZnO, ZnO:Al films according to the present invention as shown in FIG. 4. This is attributable to that p/ZnO:Al boundary or i/p boundary was damaged due to high energy ions flying to the substrate at the initial stage of ZnO:Al film formation by the sputtering.

EXAMPLE 5

Figure 5A:
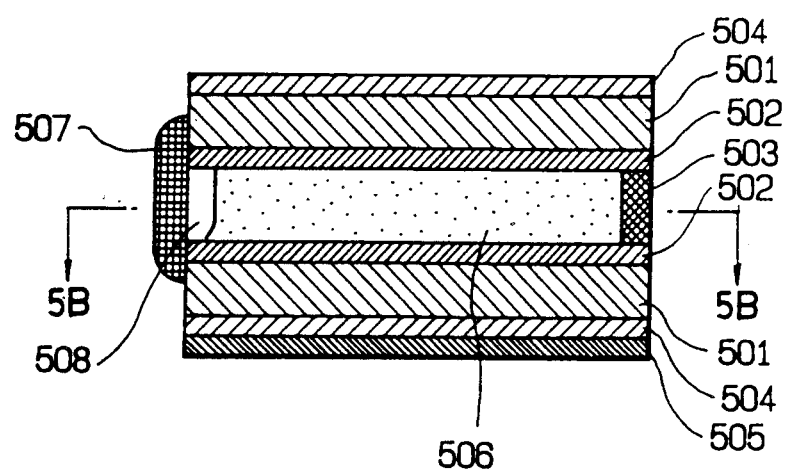
FIG. 5(a) is a schematic cross sectional view for a structure of a liquid crystal display cell and FIG. 5(b) is a transversal cross sectional view of the cell taken along the cross section 5B-5B in FIG. 5(A).
Figure 5B:
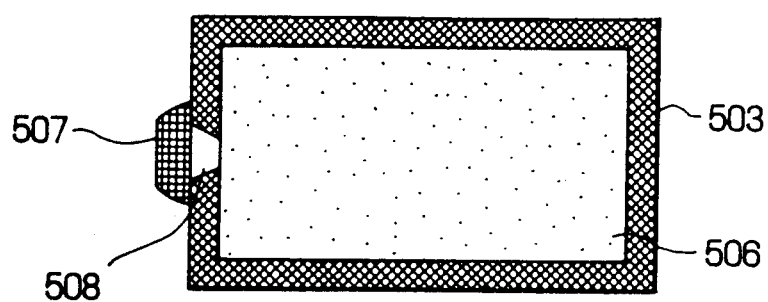

A liquid crystal display cell of a structure shown in FIG. 5 was prepared by using ZnO:Al shown in Example 3.

The liquid crystal display cell was prepared by a usual method of preparing a field effect liquid crystal display cell. That is, after depositing a ZnO:Al film 502 on a glass substrate 501 by the same procedures as in Example 3, a predetermined patterning was applied to the thus formed ZnO:Al film 502 and then orientation treatment was applied to the surface for applying orientation to liquid crystal molecules by a rubbing method. Low melting glass paste as a periphery sealing material 503 was printed by using a screen printing method to a predetermined thickness to the peripheral portion of the substrate while leaving a liquid crystal injection port 503 for injecting liquid crystals. A pair of the substrates thus treated were overlaid, with the ZnO:Al films 502 being opposed such that the direction of orientation being in perpendicular between each other and press-bonded under heating at 200° C. for 2 hours at a substrate gap of 50 μm. Then, after injecting commercially available twist nematic liquid crystals 506 into the thus obtained vessel of the liquid crystal display cell through the liquid crystal injection hole 508, the injection hole 508 was sealed with hole sealer 507 made of epoxy resin. Further, for visualizing the displacement of the liquid crystal molecules, a polarization film 504 and a reflection film 505 were formed on a glass substrate.

For the comparison, a similar liquid crystal display cell was prepared by using ZnO:Al by RF sputtering shown in Example 4. Orientation of the liquid crystals was examined visually after DC voltage application test for 250 hours and the results are shown in Table 9. In Table 9, symbol "o" indicates satisfactory homogenous orientation with no degradation in the orientation, while symbol "x" indicates that homogenous orientation was deteriorated.

Further, when the surface state of the ZnO:Al film just after the formation was observed by an optical microscope, granular unevenness of about 2-10 um size was observed in the ZnO:Al film prepared by RF sputtering. The unevenness was formed from target constituent particles or the fragments thereof formed directly from the target material during sputtering and deposited as obstacles on the substrate, which were partially recognized as spot-like image defects when the device was operated as a liquid crystal display cell.

On the contrary, the foregoing image defects were not recognized on the liquid crystal display cell using the ZnO:Al film by the method according to the present invention but satisfactory image quality was obtained, showing that the transparent electroconductive film according to the present invention is useful also for the liquid crystal display device.

TABLE 1

| Gas used | Flow rate | Substrate temperature (°C.) | Inner pressure (Torr) | Electric furnace temperature(°C.)/ Microwave power (W) |
|---|---|---|---|---|
| DEZn | $1.5 \times 10^{-6}$ mol/min | 200 | 0.5 | 500/200 |
| Ar | 15 sccm | | | |
| O$_2$/Ar (1%) | 10 sccm | | | |

TABLE 2

| Specimen | Light permeability (%) (500 nm) | Resistivity ($\Omega \cdot$ cm) | Hole mobility (electron) (cm$^2$/V · S) |
|---|---|---|---|
| ZnO film formed by the method of the present invention | 90 | $3 \times 10^{-3}$ | 20 |
| ZnO film formed by RF sputtering | 88 | $8 \times 10^{-3}$ | 9 |

TABLE 3

| RF power (W) | Inner pressure (Torr) | Substrate temperature (°C.) | Film-forming period (minute) |
|---|---|---|---|
| 50 | 0.05 | 85 | 120 |

TABLE 4

| Specimen | Light permeability (%) (550 nm) | Resistivity ($\Omega \cdot$ cm) | Hole mobility (electron) (cm$^2$/V · S) |
|---|---|---|---|
| ZnO film of the the present invention | 90 | $3 \times 10^{-3}$ | 20 |
| ZnO:Al film of the present invention | 90 | $9 \times 10^{-4}$ | 24 |

TABLE 5

| Gas used | Flow rate | Substrate temperature (°C.) | Inner pressure (Torr) | Microwave power (W) |
|---|---|---|---|---|
| DMZn | $1.5 \times 10^{-6}$ mol/min | 200 | 0.2 | 200 |
| Ar | 15 sccm | | | |
| (TMAl) | (20 sccm) ($4.0 \times 10^{-9}$ mol/min) | | | |
| H$_2$ | 5 sccm | | | |
| O$_2$ | 1 vol. % based on Ar | | | |
| Ar | 10 sccm | | | |

( ): upon doping

TABLE 6

| Specimen | Light permeability (%) (550 nm) | Resistivity ($\Omega \cdot$ cm) | Hole mobility (electron) (cm$^2$/V · S) |
|---|---|---|---|
| ZnO film of the the present invention | 91 | $4 \times 10^{-3}$ | 18 |
| ZnO:Al film of the present invention | 91 | $1 \times 10^{-3}$ | 20 |

TABLE 7

| | Gas used | Flow rate (sccm) | Inner pressure (Torr) | Substrate temperature (°C.) | RF discharging power (W)* | Film thickness (Å) |
|---|---|---|---|---|---|---|
| p | SiH$_4$/H$_2$ (10%) | 3 | | | | |
| | B$_2$H$_6$/H$_2$ (3000 ppm) | 1.5 | 2.0 | 200 | 25 | 100 |
| i | SiH$_4$ (100%) | 1.0 | 0.2 | 250 | 1.2 | 5000 |
| n | SiH$_4$/(100%) | 0.2 | | | | |
| | PH$_3$/H$_2$ (2500 ppm) | 1.6 | 0.5 | 250 | 1.5 | 300 |

*With frequency of 13.56 MHz was used.

TABLE 8

| Specimen | Open voltage (V) | Short-circuit photocurrent (mA/cm$^2$) | Curve factor | Conversion efficiency (%) |
|---|---|---|---|---|
| A* | 0.94 | 16.1 | 0.70 | 10.5 |
| B** | 0.94 | 14.8 | 0.68 | 9.5 |

*Photovoltaic device using ZnO, ZnO:Al according to the present invention
**Photovoltaic device using ZnO, ZnO:Al according to RF sputtering

TABLE 9

| | Liquid crystal display cell using ZnO:Al film obtained by the method of the present invention | Liquid crystal display cell using ZnO:Al film obtained by the RF sputtering |
|---|---|---|
| State of orientation after elapse of 250 hours from DC voltage application test | | X |

What is claimed is:

1. A method for forming a functional zinc oxide deposited film on a substrate capable of having C-axis orientation in a direction perpendicular to the plane of said film in a substantially enclosed film-forming chamber, comprising:
   (i) generating a precursor (a) capable of contributing to the formation of said deposited film by applying activation energy to a gaseous alkyl zinc compound represented by the general formula: R-Zn-R, where R is an alkyl group of 1 to 4 carbon atoms, in a precursor-generating activation chamber situated separately from said film-forming chamber;
   (ii) generating an active species (b) which is chemically reactive with said precursor by applying activation energy to $O_2$ gas or $O_3$ gas in an active species-generating chamber situated separately from said film-forming chamber and said precursor-generating chamber;
   (iii) introducing said precursor (a) and said active species (b) into said film-forming chamber, wherein a substrate on which said film is to be deposited is disposed, at a volume ratio of said precursor (a) to said active species (b) of 80:2 to 1:80 based on flow ratio; and
   (iv) chemically reacting said precursor (a) and said active species (b) while maintaining the inner pressure of said film-forming chamber at a value of 0.001 to 100 Torr and the temperature of the substrate from 50 to 500° C., thereby forming a functional zinc oxide deposited film on the surface of said substrate.

2. The method according to claim 1, wherein said alkyl zinc compound is dimethyl zinc or diethyl zinc.

3. The method according to claim 1 which further comprises generating an active species (c) by applying activation energy to a gaseous material capable of imparting an impurity, and introducing said active species (c) into the film-forming chamber, thereby doping the functional zinc oxide deposited film with an impurity caused by said active species (c).

4. The method according to claim 3, wherein said capable of imparting an impurity is a member selected from the group consisting of $Al(CH_3)_3$, $Al(C_2H_5)_3$, $In(CH_3)_3$ and $In(C_2H_5)_3$.

* * * * *

UNITED STATES PATENT AND TRADEMARK OFFICE
CERTIFICATE OF CORRECTION

PATENT NO. : 5,002,796

DATED : March 26, 1991

INVENTOR(S) : Shoji Nishida

It is certified that error appears in the above-identified patent and that said Letters Patent is hereby corrected as shown below:

COLUMN 2

Line 11, "attain" should read --attained--.

COLUMN 4

Line 6, "film having" should read --film is obtained having--.
Line 7, "much more excellent than" should read --far superior to--.
Line 13, "deposited film" should read --a desirable ZnO deposited film--.

COLUMN 13

TABLE 9, "State of orien-     O     X" should read --State of orien-     O     X--.

UNITED STATES PATENT AND TRADEMARK OFFICE
CERTIFICATE OF CORRECTION

PATENT NO. : 5,002,796
DATED : March 26, 1991
INVENTOR(S) : Shoji Nishida

It is certified that error appears in the above-identified patent and that said Letters Patent is hereby corrected as shown below:

COLUMN 14

Line 25, "said" should read --said material--.

Signed and Sealed this

Seventeenth Day of November, 1992

Attest:

DOUGLAS B. COMER

*Attesting Officer*     *Acting Commissioner of Patents and Trademarks*